US010522065B2

(12) United States Patent
Tan et al.

(10) Patent No.: US 10,522,065 B2
(45) Date of Patent: Dec. 31, 2019

(54) TRANSMITTING ELECTRODE SCAN DRIVING UNIT, DRIVING CIRCUIT, DRIVING METHOD AND ARRAY SUBSTRATE

(71) Applicants: Boe Technology Group Co., Ltd., Beijing (CN); Chengdu Boe Optoelectronics Technology Co., Ltd., Sichuan (CN)

(72) Inventors: Wen Tan, Beijing (CN); Yin Deng, Beijing (CN); Jia Chen, Beijing (CN)

(73) Assignees: BOE TECHNOLOGY GROUP CO., LTD., Beijing (CN); CHENGDU BOE OPTOELECTRONICS TECHNOLOGY CO. LTD., Sichuan (CN)

( * ) Notice: Subject to any disclaimer, the term of this patent is extended or adjusted under 35 U.S.C. 154(b) by 0 days.

(21) Appl. No.: 15/512,161

(22) PCT Filed: May 6, 2016

(86) PCT No.: PCT/CN2016/081206
§ 371 (c)(1),
(2) Date: Mar. 17, 2017

(87) PCT Pub. No.: WO2017/133100
PCT Pub. Date: Aug. 10, 2017

(65) Prior Publication Data

US 2018/0151101 A1 May 31, 2018

(30) Foreign Application Priority Data

Feb. 2, 2016 (CN) .......................... 2016 1 0074535

(51) Int. Cl.
*G09G 3/02* (2006.01)
*G09G 3/20* (2006.01)
*G11C 19/28* (2006.01)

(52) U.S. Cl.
CPC ................ *G09G 3/02* (2013.01); *G09G 3/20* (2013.01); *G09G 3/2092* (2013.01); *G11C 19/28* (2013.01);
(Continued)

(58) Field of Classification Search
CPC .... G09G 3/02; G09G 3/20; G09G 2310/0243; G09G 2310/0286
See application file for complete search history.

(56) References Cited

U.S. PATENT DOCUMENTS

2014/0347284 A1 11/2014 Lee et al.
2015/0248867 A1 9/2015 Tan et al.
(Continued)

FOREIGN PATENT DOCUMENTS

CN 102024401 4/2011
CN 103345911 10/2013
(Continued)

OTHER PUBLICATIONS

First Office Action for Chinese Patent Application No. 201610074535.2 dated Oct. 23, 2017.
(Continued)

*Primary Examiner* — Charles V Hicks
(74) *Attorney, Agent, or Firm* — Calfee, Halter & Griswold LLP

(57) ABSTRACT

A transmitting electrode scan driving unit is disclosed including a shift register unit having a start signal input terminal, a first clock signal input terminal and a scan signal output terminal, and a plurality of scan driving signal generation unit each having a second clock signal input
(Continued)

terminal, a scan signal input terminal, a driving signal input terminal and a scan driving signal output terminal. The scan signal input terminal is connected with the scan signal output terminal of the shift register unit. Also disclosed are a driving circuit, a driving method, an array substrate and a display apparatus.

10 Claims, 4 Drawing Sheets

(52) U.S. Cl.
CPC ............... *G09G 2310/0243* (2013.01); *G09G 2310/0267* (2013.01); *G09G 2310/0286* (2013.01)

(56) References Cited

U.S. PATENT DOCUMENTS

| | | | | |
|---|---|---|---|---|
| 2016/0188091 | A1* | 6/2016 | Sun | G06F 3/044 345/174 |
| 2016/0259455 | A1 | 9/2016 | Li et al. | |
| 2017/0068385 | A1 | 3/2017 | Lu et al. | |

FOREIGN PATENT DOCUMENTS

| | | | |
|---|---|---|---|
| CN | 103345911 | A | 10/2013 |
| CN | 103682116 | A | 3/2014 |
| CN | 104103321 | | 10/2014 |
| CN | 104240631 | A | 12/2014 |
| CN | 104505014 | A | 4/2015 |
| CN | 104537972 | A | 4/2015 |
| CN | 104537973 | | 4/2015 |
| CN | 104576950 | A | 4/2015 |
| CN | 104777936 | A | 7/2015 |
| CN | 104992662 | A | 10/2015 |
| CN | 105161628 | A | 12/2015 |
| CN | 105183224 | A | 12/2015 |
| CN | 105528984 | | 4/2016 |

OTHER PUBLICATIONS

Second Office Action for Chinese Patent Application No. 201610074535.2 dated Apr. 8, 2018.

International Search Report and Written Opinion from PCT/CN16/81206 dated Nov. 9, 2016.

* cited by examiner

TRANSMITTING ELECTRODE SCAN DRIVING UNIT, DRIVING CIRCUIT, DRIVING METHOD AND ARRAY SUBSTRATE

CROSS-REFERENCE TO RELATED APPLICATIONS

The present application is the U.S. national phase entry of PCT/CN2016/081206, with an international filing date of May 6, 2016, which claims the benefit of Chinese Patent Application No. 201610074535.2, filed on Feb. 2, 2016, the entire disclosures of which are incorporated herein by reference.

TECHNICAL FIELD

The present disclosure relates to the field of display technologies, and particularly to a transmitting electrode scan driving unit, a driving circuit, a driving method and an array substrate.

BACKGROUND

In-cell touch screen panels (TSPs) are among trends in TSP technologies. In an in-cell TSP, common electrodes are generally used as transmitting (TX) electrodes. In a conventional design, TX driving signals are applied to the common electrodes by an external driving integrated circuit (IC) through fan-out lead wires located at a seal region.

With an increase of the size of the panel, the number of the TX electrodes increases, thus requiring more space for arrangement of the fan-out lead wires. Therefore, the in-cell technology is restricted from application in a panel with a large size and a narrow bezel. Additionally, as the TX fan-out lead wires are located either above or below a gate driver on array (GOA) circuit in an array substrate, crosstalk may be easily caused between signals applied to the TX electrodes and the GOA circuit, rendering the touch screen less reliable.

SUMMARY

It would be advantageous to achieve a transmitting electrode scan driving unit, which may require a reduced number of fan-out lead wires for TX electrodes. It would also be desirable to provide a transmitting electrode scan driving circuit including the transmitting electrode scan driving unit, a method of driving the driving circuit, an array substrate including the driving circuit, and a display apparatus including the array substrate.

According to an aspect of the present disclosure, a transmitting electrode scan driving unit is provided comprising: a shift register unit having a start signal input terminal, a first clock signal input terminal and a scan signal output terminal; and a plurality of scan driving signal generation units each having a second clock signal input terminal, a scan signal input terminal, a driving signal input terminal and a scan driving signal output terminal, the scan signal input terminal being connected with the scan signal output terminal of the shift register unit. The shift register unit is adapted to: set the scan signal output terminal to be at a first level in response to the first clock signal input terminal being supplied with a first active level and to the start signal input terminal being supplied with a start signal having the first level; set the scan signal output terminal to be at a second level logically opposite to the first level in response to the first clock signal input terminal being supplied with the first active level and to the start signal input terminal being supplied with the second level; and maintain a level of the scan signal output terminal unchanged in response to the first clock signal input terminal being supplied with an inactive level. Each of the plurality of scan driving signal generation units is adapted to generate and output via the scan driving signal output terminal a scan driving signal based on a driving signal applied to the driving signal input terminal, in response to the scan signal input terminal being supplied with the first level and to the second clock signal input terminal being supplied with a second active level.

In some embodiments, the second active level is the first level, and each of the plurality of scan driving signal generation units comprises an AND gate module and a voltage conversion module. The AND gate module is connected to the second clock signal input terminal and the scan signal input terminal, and is adapted to set a first node to be at the first level in response to the second clock signal input terminal and the scan signal input terminal being supplied with the first level. The voltage conversion module is connected to the first node, the driving signal input terminal and the scan driving signal output terminal, and has a first direct voltage input terminal and a second direct voltage input terminal, the voltage conversion module being adapted to set the scan driving signal output terminal to be at a voltage applied to the first direct voltage input terminal in response to the first node being at the first level and to the driving signal input terminal being supplied with the first level, and to set the scan driving signal output terminal to be at a voltage applied to the second direct voltage input terminal in response to the first node being at the second level or to the driving signal input terminal being supplied with the second level.

In some embodiments, the AND gate module comprises a first NAND gate and an inverter. The first NAND gate is connected to the second clock signal input terminal and the scan signal input terminal, and is adapted to set a second node to be at the second level in response to the second clock signal input terminal and the scan signal input terminal being supplied with the first level. The inverter is connected to the second node and the first node, and is adapted to set the first node to be at a level logically opposite to a level of the second node.

In some embodiments, the voltage conversion module comprises a second NAND gate, a first transistor having a threshold voltage of the first level, and a second transistor having a threshold voltage of the second level. The second NAND gate is connected to the first node and the driving signal input terminal, and is adapted to set a third node to be at the second level in response to the first node being at the first level and to the driving signal input terminal being supplied with the first level. The first transistor has a gate, a source and a drain, the gate connected to the third node, one of the source and the drain connected to the first direct voltage input terminal, and the other connected to the scan driving signal output terminal. The second transistor has a gate, a source and a drain, the gate of the second transistor connected to the third node, one of the source and the drain of the second transistor connected to the second direct voltage input terminal, and the other connected to the scan driving signal output terminal.

In some embodiments, the shift register unit comprises a first transmission gate, a second transmission gate, a first inverter, a second inverter, a third inverter and a fourth inverter. The first transmission gate has a first control terminal, a second control terminal, an input terminal and an output terminal, the first control terminal connected to the first clock signal input terminal. The second transmission gate has a first control terminal, a second control terminal connected to the first clock signal input terminal, an input terminal, and an output terminal connected to the output terminal of the first transmission gate. The first inverter has an input terminal connected to the first clock signal input terminal and an output terminal connected to the second control terminal of the first transmission gate and the first control terminal of the second transmission gate. The second inverter has an input terminal connected to the start signal input terminal and an output terminal connected to the input terminal of the first transmission gate. The third inverter has an input terminal connected to the output terminal of the second transmission gate and an output terminal connected to the scan signal output terminal. The fourth inverter has an input terminal connected to the scan signal output terminal and an output terminal connected to the input terminal of the second transmission gate.

In some embodiments, the transmitting electrode scan driving unit comprises three scan driving signal generation units.

In some embodiments, the first level is a high level, the second level is a low level, the first active level is a high level, and the second active level is a high level.

According to another aspect of the present disclosure, a transmitting electrode scan driving circuit is provided comprising a plurality of the transmitting electrode scan driving units as described above, a first clock signal line, and a plurality of second clock signal lines. The shifter register units of the plurality of transmitting electrode scan driving units are cascaded with each other such that the scan signal output terminal of the shift register unit of each of the transmitting electrode scan driving units, other than the last one of the transmitting electrode scan driving units, is connected to the start signal input terminal of the shift register unit of a succeeding transmitting electrode scan driving unit. The first clock signal input terminals of the shift registers of the plurality of transmitting electrode scan driving units are connected to the first clock signal line. The second clock input terminals of the plurality of scan driving signal generation units of each of the transmitting electrode scan driving units are connected one-to-one to the plurality of second clock signal lines.

According to yet another aspect of the present disclosure, a method of driving the transmitting electrode scan driving circuit as described above is provided comprising applying a first clock signal to the first clock signal line. Clock pulses of the first clock signal have a high level as the first active level. The method further comprises applying, prior to end of one of the clock pulses, a start signal pulse to the start signal input terminal of the shift register unit of the first one of the transmitting electrode scan driving units. The start signal pulse ends no earlier than termination of the clock pulse and no later than initiation of a succeeding clock pulse. The method further comprises applying a respective second clock signal to each of the plurality of second clock signal lines. Clock pulses of the respective second clock signals have a high level as the second active level, each of the second clock signals has a respective clock pulse within a time interval between every two temporally neighboring clock pulses of the first clock signal, and the individual clock pulses do not temporally overlap with each other.

According to still another aspect of the present disclosure, an array substrate is provided comprising a base substrate and the transmitting electrode scan driving circuit as described above. The transmitting electrode scan driving circuit is patterned on the base substrate.

According to a further aspect of the present disclosure, a display apparatus is provided comprising the array substrate as described above.

These and other aspects of the present disclosure will be apparent from and elucidated with reference to the embodiment(s) described hereinafter.

BRIEF DESCRIPTION OF THE DRAWINGS

Features and advantages of the present disclosure will be understood more clearly with reference to accompany drawings that are illustrative and are not to be interpreted as limiting of the present disclosure, in which.

DETAILED DESCRIPTION

For a better understanding of the objectives, features and advantages of the present disclosure, the present disclosure will be further described in detail in connection with the accompanying drawings and specific embodiments. It is to be noted that the embodiments or features in the embodiments of the present disclosure may be combined with each other without conflict.

In the following description many specific details are set forth for a thorough understanding of the present disclosure; however the present disclosure may be implemented in other manners than described herein. Therefore, the scope of the present disclosure is not limited by the specific embodiments as disclosed below.

Figure 1:
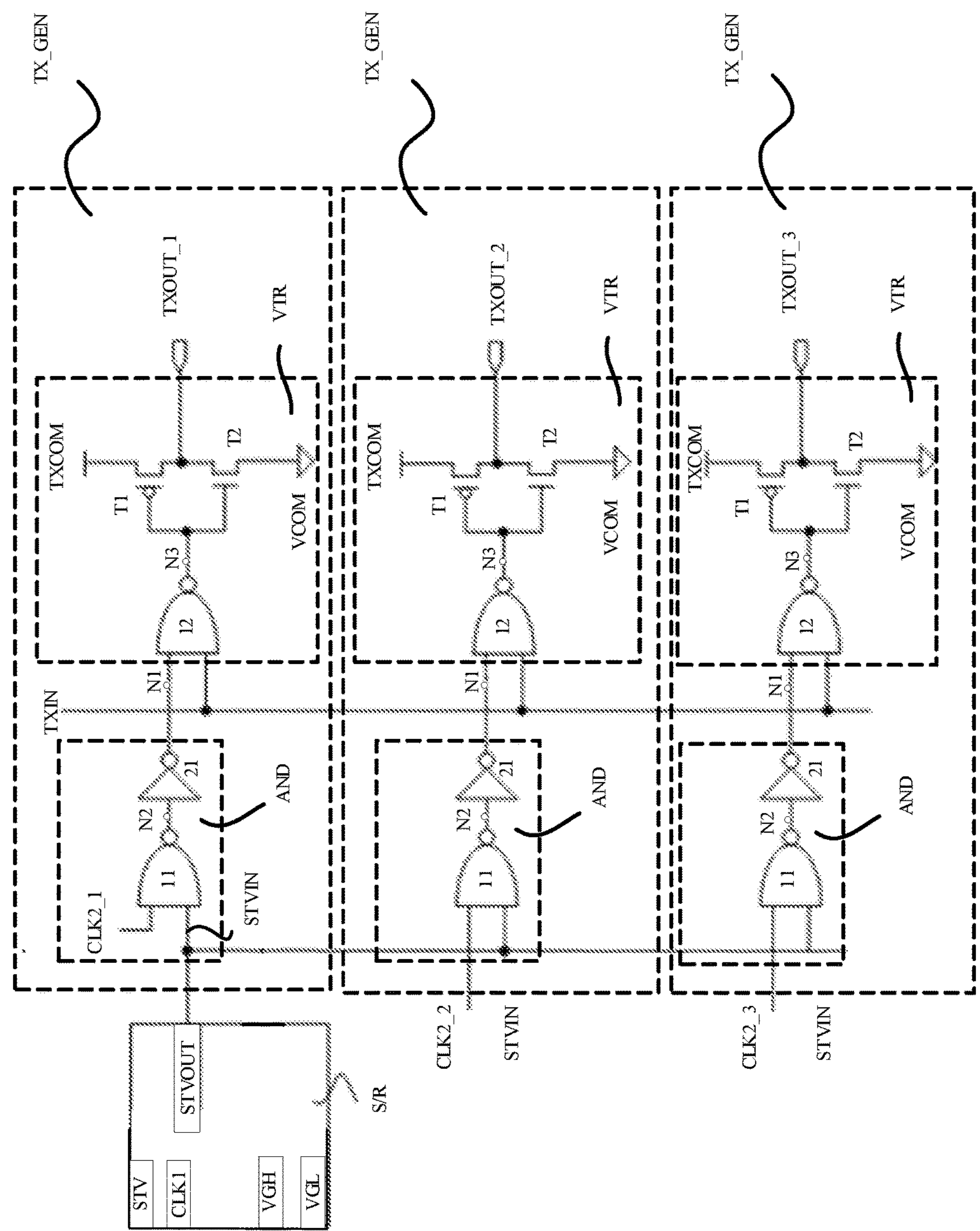
FIG. 1 is a schematic circuit diagram of a transmitting electrode scan driving unit according to an embodiment of the present disclosure.

FIG. 1 is a schematic circuit diagram of a transmitting electrode scan driving unit according to an embodiment of the present disclosure.

Referring to FIG. 1, the transmitting electrode scan driving unit includes a shift register unit S/R and three scan driving signal generation units (each denoted as TX_GEN in the figure).

The shift register unit S/R has a start signal input terminal STV, a first clock signal input terminal CLK1 and a scan signal output terminal STVOUT.

The shift register unit S/R is adapted to set the scan signal output terminal STVOUT to be at a first level when the level of the first clock signal input terminal CLK1 is a first active level and the start signal input terminal STV is supplied with a start signal having the first level.

The shift register unit S/R is further adapted to set the scan signal output terminal STVOUT to be at a second level logically opposite to the first level when the level of the first clock signal input terminal CLK1 is the first active level and the start signal input terminal is supplied with the second level.

The shift register unit S/R is further adapted to maintain a level of the scan signal output terminal STVOUT unchanged when the level of the first clock signal input terminal CLK1 is an S/R inactive level.

Each of the scan driving signal generation units TX_GEN has a second clock signal input terminal CLK2, a scan signal input terminal STVIN, a driving signal input terminal TXIN and a scan driving signal output terminal TXOUTx. The scan signal input terminal STVIN is connected with the scan signal output terminal STVOUT of the shift register unit S/R.

For ease of discrimination, the second clock signal input terminal CLK2 of the n-th TX_GEN is denoted as CLK2_*n*, where n is 1, 2 or 3. Moreover, the scan driving signal output terminal TXOUTx of the n-th TX_GEN is denoted as TXOUTx_n, where n is 1, 2 or 3.

Each TX_GEN is adapted to generate and output, via a respective scan driving signal output terminal, a scan driving signal based on a driving signal input to the driving signal input terminal TXIN when the scan signal input terminal STVOUT is supplied with the first level and the second clock signal input terminal is supplied with a second active level.

Figure 2:
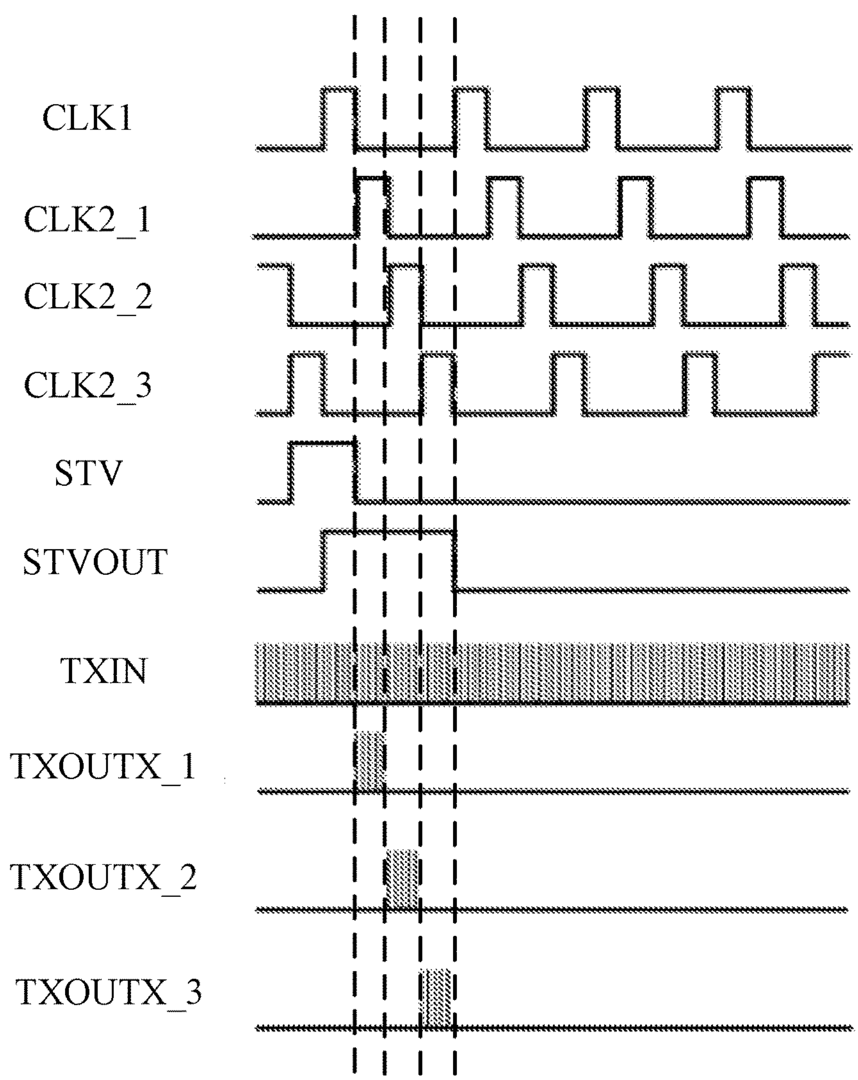
FIG. 2 is a timing diagram schematically showing operations of the transmitting electrode scan driving unit according to the embodiment of FIG. 1.

FIG. 2 is a timing diagram schematically showing operations of the transmitting electrode scan driving unit according to the embodiment of FIG. 1. The operations of the transmitting electrode scan driving unit are described below with reference to FIGS. 1 and 2.

Assume that the first level is a high level, that the second level is a low level, that the first active level is a high level, and that the second active level is a high level.

A first clock signal is applied to the first clock signal input terminal CLK1. The high level of the clock pulses of the first clock signal is the first active level. Prior to the end of one of the clock pulses of the first clock signal, a start signal having a high level is applied to the start signal input terminal STV, with the end time of the high level of the start signal being no earlier than the end time of the clock pulse and no later than the start time of a succeeding clock pulse.

Respective second clock signals are applied to the respective second clock signal input terminals (CLK2_1, CLK2_2 and CLK2_3, in this example). In this example, the duty ratio of the second clock signals is ¼. The high level of the clock pulses of the second clock signals is the active level (second active level) of the TX_GEN. The clock pulses of the second clock signals are sequentially provided such that the clock pulses of any one of the second clock signals do not overlap temporally with the clock pulses of another one of the second clock signals. In a time interval between every two temporally neighboring clock pulses of the first clock signal, each of the second clock signals has a respective clock pulse.

Referring still to FIG. 2, when the start signal input terminal STV is supplied with a start signal having a high level, since the first clock signal applied to the first clock signal input terminal CLK1 is at a high level, the scan signal output terminal STVOUT of the shift register unit S/R is set to be at a high level. Thereafter, the first clock signal applied to the first clock signal input terminal CLK1 transitions to a low level, namely, a level that is inactive to the shift register unit S/R, such that the level of the scan signal output terminal STVOUT remains at the high level. Not until a next clock pulse of the first clock signal begins can it be fulfilled that the level of the first clock signal input terminal CLK1 is the first active level and the level of the start signal input terminal STV is a low level. At this point, the scan signal output terminal STVOUT of the shift register unit S/R is set to be at a low level.

As shown in FIG. 2, during an interval in which the scan signal output terminal STVOUT of the shift register unit S/R outputs a high level, the second clock signal input terminals CLK2_1, CLK2_2 and CLK2_3 of the scan driving signal generation unit TX_GEN are successively set to be at a high level. Each TX_GEN is configured to output a scan driving signal when its second clock signal input terminal is at a high level and the output terminal STVOUT of the shift register unit S/R is at a high level. In this example, the three scan driving signal output terminals TXOUTx_1, TXOUTx_2 and TXOUTx_3 of the TX_GEN successively output three scan driving signals, as shown in FIG. 2.

All of the three scan driving signals are output during a phase in which the scan signal output terminal STVOUT of the shift register unit S/R is set to be at a high level, so the shift register units S/R of multiple transmitting electrode scan driving units can be cascaded together, as will be described later. This way, the scan signal output terminals STVOUT of the shift register units S/R are successively pulled to a high level, causing the transmitting electrode scan driving units to successively output respective touch scan driving signals.

In practical applications, the shift register unit S/R may have a high voltage terminal VGH supplied with a high voltage and a low voltage terminal VGL supplied with a low voltage. Such a shift register unit S/R has been shown in FIG. 1.

In some embodiments, as shown in FIG. 1, the scan driving signal generation unit TX_GEN includes an AND gate module ("AND") and a voltage conversion module VTR.

The AND gate module "AND" is connected to the second clock signal input terminal CLK2_*n* (assuming that this TX_GEN is the n-th TX_GEN) and the scan signal input terminal STVIN. The AND gate module "AND" is used to set a first node N1 to be at the first level when both the second clock signal input terminal CLK2_*n* and the scan signal input terminal STVIN are at the first level.

The voltage conversion module VTR is connected to the first node N1, the driving signal input terminal TXIN and the scan driving signal output terminal TXOUTx_n, and has a first direct voltage input terminal TXCOM and a second direct voltage input terminal VCOM. The voltage conversion module VTR is used to set the level of the scan driving signal output terminal TXOUTx_n to a voltage input via the first direct voltage input terminal TXCOM when the first node N1 is at the first level and the driving signal input terminal TXIN is at the first level, and to set the level of the scan driving signal output terminal TXOUTx_n to a voltage input via the second direct voltage input terminal VCOM when the first node N1 is at the second level or the driving signal input terminal TXIN is at the second level.

Thus, the high level and low level of the scan driving signal output are in consistency with the voltages input via the above-mentioned two direct voltage input terminals TXCOM and VCOM, respectively, enabling the scan driving signal to meet a predetermined driving requirement. Specifically, the voltage input via the first direct voltage input terminal TXCOM may be the voltage required by the touch control detection chip, and the voltage input via second direct voltage input terminal VCOM may be the voltage of the common electrode.

In some embodiments, as shown in FIG. 1, the AND gate module "AND" includes a NAND gate 11 (referred to here as a first NAND gate) and an inverter 21.

The first NAND gate 11 is connected to the second clock signal input terminal CLK2_*n* and the scan signal input terminal STVIN. The first NAND gate 11 is used to set a second node N2 to be at the second level when the second clock signal input terminal CLK2_*n* and the scan signal input terminal STVIN are at the first level.

The inverter 21 is connected to the second node N2 and the first node N1. The inverter 21 is used to set the first node N1 to be at a level logically opposite to a level of the second node N2.

In some embodiments, the voltage conversion module VTR includes a second NAND gate 12, a first transistor T1, and a second transistor T2, and has the first direct voltage input terminal TXCOM and the second direct voltage input terminal VCOM.

The second NAND gate 12 is connected to the first node N1 and the driving signal input terminal TXIN. The second NAND gate 12 is used to set a third node N3 to be at the second level when the first node N1 is at the first level and the driving signal input terminal TXIN is at the first level.

The gates of the first transistor T1 and the second transistor T2 are connected to the third node N3. The source of the first transistor T1 is connected to the first direct voltage input terminal TXCOM, and the drain of the first transistor T1 is connected to the scan driving signal output terminal TXOUTx_n. The drain of the second transistor T2 is connected to the scan driving signal output terminal TXOUTx_n, and the source of the second transistor T2 is connected to the second direct voltage input terminal VCOM. The threshold voltage of the first transistor T1 is the first level, and the threshold voltage of the second transistor T2 is the second level.

It should be understood that the sources and drains of the first transistor T1 and the second transistor T2 are generally fabricated to be symmetrical and thus may be used interchangeably.

Figure 3:
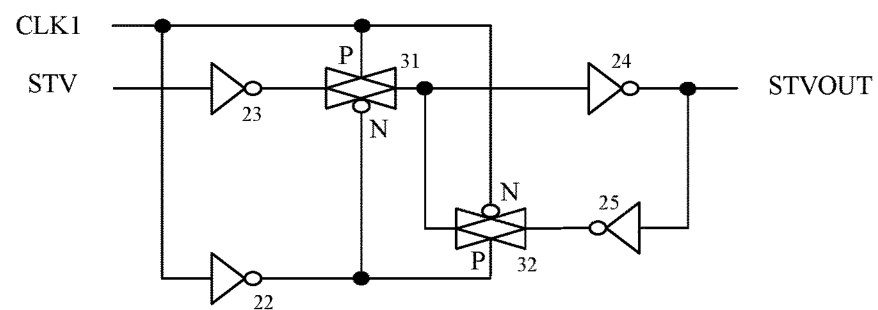
FIG. 3 is a schematic circuit diagram of a shift register of the transmitting electrode scan driving unit according to the embodiment of FIG. 1.

FIG. 3 is a schematic circuit diagram of a shift register of the transmitting electrode scan driving unit according to the embodiment of FIG. 1.

Referring to FIG. 3, the shift register unit S/R includes a first transmission gate 31, a second transmission gate 32, and four inverters 22, 23, 24 and 25.

A first control terminal P of the first transmission gate 31 and a second control terminal N of the second transmission gate 32 are each connected to the first clock signal input terminal CLK1. A first control terminal P of the second transmission gate 32 and a second control terminal N of the first transmission gate 31 are each connected to an output terminal of the first inverter 22. An input terminal of the first inverter 22 is connected to the first clock signal input terminal CLK1. An input terminal of the second inverter 23 is connected to the start signal input terminal STV, and an output terminal of the second inverter 23 is connected to the input terminal of the first transmission gate 31 (in FIG. 3, the left terminal of the first transmission gate 31 is used as the input terminal, and the right terminal as the output terminal). The output terminal of the first transmission gate 31 is connected to the output terminal of the second transmission gate 32 (in FIG. 3, the left terminal of the second transmission gate 32 is used as the output terminal, and the right terminal as the input terminal). An input terminal of the third inverter 24 is connected to the output terminal of the second transmission gate 32, and an output terminal of the third inverter 24 is connected to the scan signal output terminal STVOUT. An input terminal of the fourth inverter 25 is connected to the scan signal output terminal STVOUT, and an output terminal of the fourth inverter 25 is connected to the input terminal of the second transmission gate 32.

Each of the first transmission gate 31 and the second transmission gate 32 is configured to be turned on when its first control terminal P is at the first level and its second control terminal N at the second level, thus transferring the signal applied to the input terminal to the output terminal.

Operations of the shift register unit S/R are described below with reference to FIGS. 2 and 3.

When the level of the clock signal input terminal CLK1 is the first level, the first control terminal P of the first transmission gate 31 is at the first level and the second control terminal N at the second level. Therefore, the first transmission gate 31 is turned on, such that the input terminal of the first transmission gate 31 is set to be at the second level and thus the output terminal is set to be at the second level when the start signal input terminal STV is supplied with a start signal having the first level. Further, the third inverter 24 sets the level of the scan signal output terminal STVOUT to the first level. The connection state of the control terminals of the second transmission gate 32 is opposite to that of the first transmission gate 31, so they operate in opposite states. Thus, the second transmission gate 32 is turned off.

When the level of the clock signal input terminal CLK1 transitions to the second level, the first control terminal P of the first transmission gate 31 is at the second level, and the second control terminal N is at the first level. Therefore, the first transmission gate 31 is turned off, and the second transmission gate 32 is turned on. Since the level of the scan signal output terminal STVOUT is the first level, the inverter 25 would set the level of the input terminal of the second transmission gate 32 to the second level. Further, the second transmission gate 32 also sets the level of its output terminal to the second level and in turn, the third inverter 24 sets the level of the scan signal output terminal STVOUT to the first level.

When the level of the clock signal input terminal CLK1 transitions again to the first level, the first transmission gate 31 is again turned on, and the second transmission gate 32 is again turned off. However, since the start signal output terminal STV has been set to be at the second level, the level of the output terminal of the first transmission gate 31 is set to the first level and in turn, the third inverter 24 sets the level of the scan signal output terminal STVOUT to the second level. Thereafter, when the clock signal input terminal CLK1 transitions again to the second level, the first transmission gate 31 is turned off, and the second transmission gate 32 is turned on. Since the level of the scan signal output terminal STVOUT is the second level, the input terminal of the second transmission gate 32 is at the first level and the output terminal of the second transmission gate 32 is also at the first level. Further, the third inverter 24 sets the level of the scan signal output terminal STVOUT to the second level.

It should be understood that the first transmission gate 31, the second transmission gate 32 and the individual inverters 22, 23, 24 and 25 each generally have a high voltage terminal VGH supplied with a high voltage and a low voltage terminal VGL supplied with a low voltage. These high voltage terminals VGH and low voltage terminals VGL are not shown in FIG. 3 for simplicity.

Figure 4:
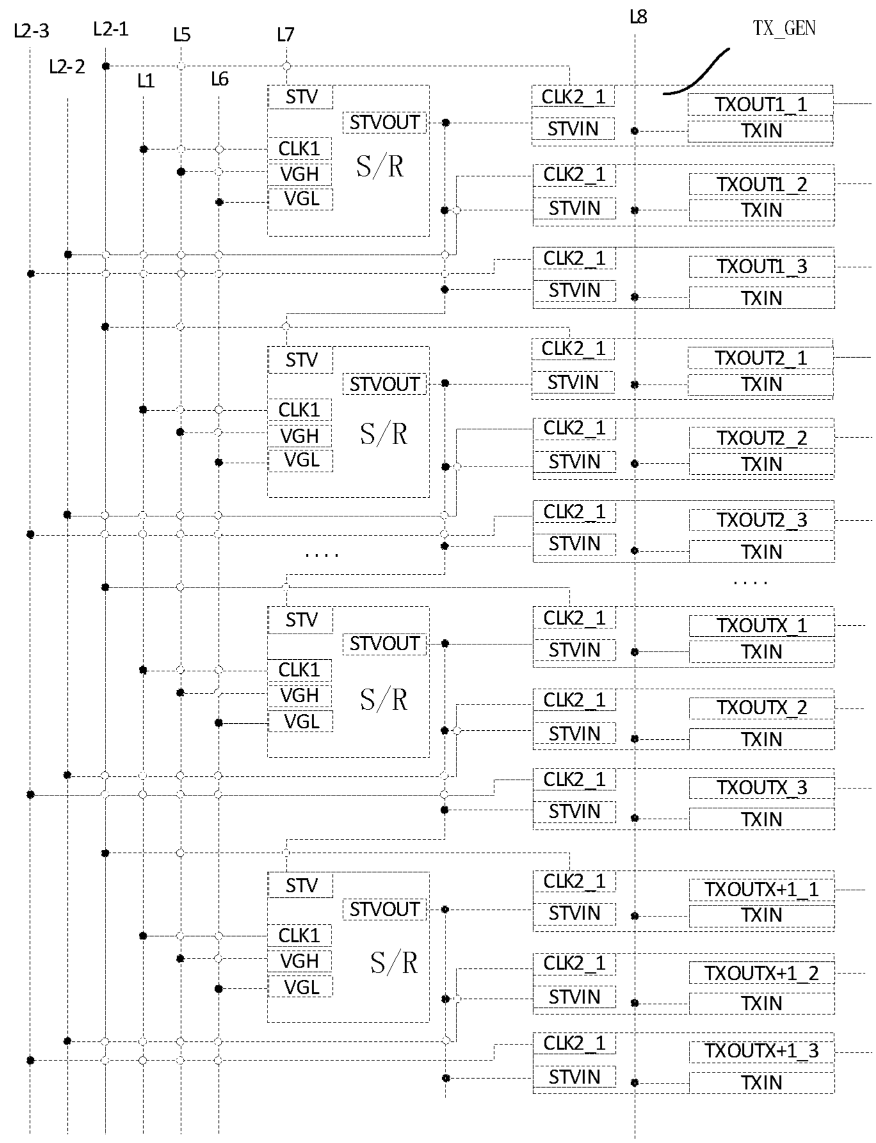
FIG. 4 is a block diagram of a transmitting electrode scan driving circuit according to an embodiment of the present disclosure.

FIG. 4 is a block diagram of a transmitting electrode scan driving circuit according to an embodiment of the present disclosure.

Referring to FIG. 4, the transmitting electrode scan driving circuit includes a plurality of transmitting electrode scan driving units, four clock signal lines L1, L2_1, L2_2 and L2_3, a high voltage line L5, a low voltage line L6, a start signal line L7 and a driving signal line L8. Each of the transmitting electrode scan driving units may be the transmitting electrode scan driving unit as described above.

For ease of discrimination, the three scan driving signal output terminals of the x-th transmitting electrode scan driving unit are represented respectively as TXOUTx_1, TXOUTx_2 and TXOUTx_3, wherein x is an integer larger than or equal to 1.

In each transmitting electrode scan driving unit, the first clock signal input terminal CLK1 is connected to the first clock signal line L1, the second clock signal input terminals CLK2_1, CLK_2 and CLK2_3 are connected one-to-one to the second clock signal lines L2_1, L2_2 and L2_3, the high voltage terminals VGH are connected to the high voltage line L5, the low voltage terminals VGL are connected to the low voltage line L6, and the respective driving signal input terminals TXIN are connected to the driving signal line L8.

The plurality of transmitting electrode scan driving units is cascaded together. Specifically, the scan signal output terminal STVOUT of the shift register unit S/R of each of the transmitting electrode scan driving units, other than the last one of the transmitting electrode scan driving units, is connected to the start signal input terminal STV of the shift register unit S/R of a succeeding transmitting electrode scan driving unit. In addition, the start signal input terminal STV of the shift register unit S/R of the first one of the transmitting electrode scan driving units is connected to the start signal line L7.

Figure 5:
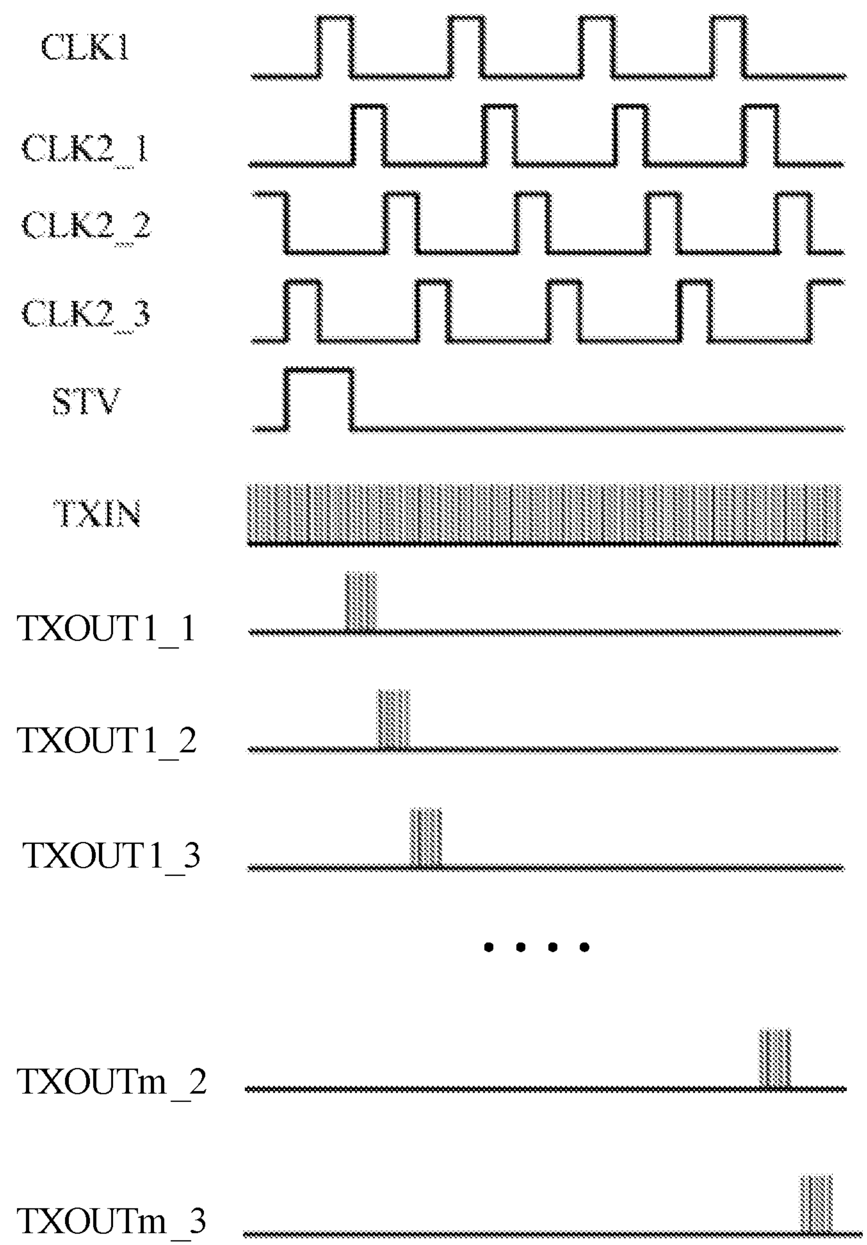
FIG. 5 is a timing diagram schematically showing operations of the transmitting electrode scan driving circuit according to the embodiment of FIG. 4.

FIG. 5 is a timing diagram schematically showing operations of the transmitting electrode scan driving circuit according to the embodiment of FIG. 4.

Similar to the operations described above in connection with FIG. 2, under the excitation of the first clock signal provided via the first clock signal input terminal CLK1, the second clock signals provided via the second clock signal input terminals CLK2_1, CLK2_2 and CLK2_3, the start signal provided via the start signal input terminal STV, and the driving signal provided via the driving signal input terminal TXIN, the cascaded transmitting electrode scan driving units of the transmitting electrode scan driving circuit successively output respective touch scan driving signals at respective scan driving signal output terminals TXOUT1_1, TXOUT1_2, TXOUT1_3, . . . , TXOUTm_2, and TXOUTm_3 (m is the number of the transmitting electrode scan driving units).

The transmitting electrode scan driving unit according to embodiments of the present disclosure may provide a plurality of scan driving signals. This makes it possible to fabricate the transmitting electrode scan driving circuit dispersedly in a bezel region of an array substrate. As such, it is unnecessary to use a great number of fan-out lead wires to connect the transmitting electrodes to the edge of the array substrate. Due to the reduced fan-out lead wires, it may also be possible to reduce the area of the bezel region of the touch control apparatus.

Although in the above embodiments the transmitting electrode scan driving unit is illustrated and described as including three scan driving signal generation units TX_GEN, the transmitting electrode scan driving unit may include other number (such as, seven) of TX_GENs. In an embodiment where the transmitting electrode scan driving unit includes seven TX_GENs, eight clock signal lines are needed, where one of them is connected to the first clock signal input terminal of the shift register unit, and the others are connected one-to-one to the second clock signal input terminals of the seven TX_GENs.

The transmitting electrode scan driving circuit as described above may be fabricated on the array substrate. Specifically, the array substrate includes a base substrate on which the transmitting electrode scan driving circuit is formed through patternization.

Further, the array substrate may be used to manufacture a display apparatus. The display apparatus herein may refer to a cell phone, a tablet computer, a navigator or any other product that has touch control and display functionality.

Although embodiments of the present disclosure have been described in connection with the drawings, various modifications and variations may be made by those skilled in the art without departing from the scope of the disclosure. These modifications and variations fall within the scope defined by the appended claims.

What is claimed is:

1. A transmitting electrode scan driving unit, comprising:

a shift register unit having a start signal input terminal, a first clock signal input terminal and a scan signal output terminal; and a plurality of scan driving signal generation units each having a second clock signal input terminal, a scan signal input terminal, a driving signal input terminal and a scan driving signal output terminal, the scan signal input terminal being connected with the scan signal output terminal of the shift register unit, wherein the shift register unit is adapted to:

set the scan signal output terminal to be at a first level in response to the first clock signal input terminal being supplied with a first active level and to the start signal input terminal being supplied with a start signal having the first level;

set the scan signal output terminal to be at a second level logically opposite to the first level in response to the first clock signal input terminal being supplied with the first active level and to the start signal input terminal being supplied with the second level; and maintain a level of the scan signal output terminal unchanged in response to the first clock signal input terminal being supplied with an inactive level; and wherein each of the plurality of scan driving signal generation units is adapted to generate and output via the scan driving signal output terminal a scan driving signal based on a driving signal applied to the driving signal input terminal, in response to the scan signal input terminal being supplied with the first level and to the second clock signal input terminal being supplied with a second active level.

2. The transmitting electrode scan driving unit of claim 1, wherein the second active level is the first level, and wherein each of the plurality of scan driving signal generation units comprises an AND gate module and a voltage conversion module, wherein:

the AND gate module is connected to the second clock signal input terminal and the scan signal input terminal, and is adapted to set a first node to be at the first level in response to the second clock signal input terminal and the scan signal input terminal being supplied with the first level; and the voltage conversion module is connected to the first node, the driving signal input terminal and the scan driving signal output terminal, and has a first direct voltage input terminal and a second direct voltage input terminal, the voltage conversion module being adapted to set the scan driving signal output terminal to be at a voltage applied to the first direct voltage input terminal in response to the first node being at the first level and to the driving signal input terminal being supplied with the first level, and to set the scan driving signal output terminal to be at a voltage applied to the second direct voltage input terminal in response to the first node being at the second level or to the driving signal input terminal being supplied with the second level.

3. The transmitting electrode scan driving unit of claim 2, wherein the AND gate module comprises a first NAND gate and an inverter, wherein:

the first NAND gate is connected to the second clock signal input terminal and the scan signal input terminal, and is adapted to set a second node to be at the second level in response to the second clock signal input terminal and the scan signal input terminal being supplied with the first level; and the inverter is connected to the second node and the first node, and is adapted to set the first node to be at a level logically opposite to a level of the second node.

4. The transmitting electrode scan driving unit of claim 2, wherein the voltage conversion module comprises a second NAND gate, a first transistor having a threshold voltage of the first level, and a second transistor having a threshold voltage of the second level, wherein:

the second NAND gate is connected to the first node and the driving signal input terminal, and is adapted to set a third node to be at the second level in response to the first node being at the first level and to the driving signal input terminal being supplied with the first level;

the first transistor has a gate, a source and a drain, the gate connected to the third node, one of the source and the drain connected to the first direct voltage input terminal, and the other connected to the scan driving signal output terminal; and the second transistor has a gate, a source and a drain, the gate of the second transistor connected to the third node, one of the source and the drain of the second transistor connected to the second direct voltage input terminal, and the other connected to the scan driving signal output terminal.

5. The transmitting electrode scan driving unit of claim 1, wherein the shift register unit comprises a first transmission gate, a second transmission gate, a first inverter, a second inverter, a third inverter and a fourth inverter, wherein:

the first transmission gate has a first control terminal, a second control terminal, an input terminal and an output terminal, the first control terminal connected to the first clock signal input terminal;

the second transmission gate has a first control terminal, a second control terminal connected to the first clock signal input terminal, an input terminal, and an output terminal connected to the output terminal of the first transmission gate;

the first inverter has an input terminal connected to the first clock signal input terminal and an output terminal connected to the second control terminal of the first transmission gate and the first control terminal of the second transmission gate;

the second inverter has an input terminal connected to the start signal input terminal and an output terminal connected to the input terminal of the first transmission gate;

the third inverter has an input terminal connected to the output terminal of the second transmission gate and an output terminal connected to the scan signal output terminal; and the fourth inverter has an input terminal connected to the scan signal output terminal and an output terminal connected to the input terminal of the second transmission gate.

6. The transmitting electrode scan driving unit of claim 1, wherein the transmitting electrode scan driving unit comprises three scan driving signal generation units.

7. The transmitting electrode scan driving unit of claim 1, wherein the first level is a high level, the second level is a low level, the first active level is a high level, and the second active level is a high level.

8. The transmitting electrode scan driving unit of claim 2, wherein the first level is a high level, the second level is a low level, the first active level is a high level, and the second active level is a high level.

9. The transmitting electrode scan driving unit of claim 5, wherein the first level is a high level, the second level is a low level, the first active level is a high level, and the second active level is a high level.

10. The transmitting electrode scan driving unit of claim 6, wherein the first level is a high level, the second level is a low level, the first active level is a high level, and the second active level is a high level.

* * * * *